United States Patent
Ha et al.

[11] Patent Number: 6,146,542
[45] Date of Patent: Nov. 14, 2000

[54] DRY ETCHING METHOD OF MULTILAYER FILM

[75] Inventors: Jae-Hee Ha, Cheongju; Sung-Hun Chi, Seoul, both of Rep. of Korea

[73] Assignee: Hyundia Electronics Industries Co., Ltd., Ichon-Shi, Rep. of Korea

[21] Appl. No.: 09/071,743

[22] Filed: May 4, 1998

[30] Foreign Application Priority Data

Jan. 9, 1998 [KR] Rep. of Korea .......................... 98-366

[51] Int. Cl.$^7$ .............................. C23F 1/00; C03C 25/68
[52] U.S. Cl. .................................. 216/2; 216/58; 216/67; 216/69; 216/70; 216/72; 216/79; 438/682; 438/683; 438/706; 438/719; 438/721; 438/723; 438/738; 438/743
[58] Field of Search ................................... 216/2, 58, 67, 216/69, 70, 72, 79; 438/706, 719, 721, 723, 738, 743, 682, 683

[56] References Cited

U.S. PATENT DOCUMENTS

| | | | |
|---|---|---|---|
| 4,376,672 | 3/1983 | Wang et al. | 156/643 |
| 4,734,157 | 3/1988 | Carbaugh et al. | 156/643 |
| 5,160,407 | 11/1992 | Latchford et al. | 156/656 |
| 5,259,923 | 11/1993 | Hori et al. | 156/643 |
| 5,856,239 | 1/1999 | Bashir et al. | 438/738 |
| 5,946,594 | 8/1999 | Iyer et al. | 438/648 |

FOREIGN PATENT DOCUMENTS

| | | |
|---|---|---|
| 8-83788 | 3/1996 | Japan . |
| 8-162442 | 6/1996 | Japan . |

OTHER PUBLICATIONS

Derwent Abstract of JP 11145145 A (priority Nov. 3, 1997), May 28, 1999.

*Primary Examiner*—William Krynski
*Assistant Examiner*—Dawn L. Garrett
*Attorney, Agent, or Firm*—Fleshner & Kim, LLP

[57] ABSTRACT

A dry etching method of a multilayer film for a semiconductor device includes a first step for etching a metallic layer or a metallic silicide layer by use of a compound gas plasma mixed by a first gas including at least two of $O_2$, $N_2$, CO, a second gas including fluorine, a third gas including chlorine, and a fourth gas including bromine, a second step for processing an entire structure formed on the semiconductor substrate by use of a fluorine gas plasma including carbon, and a third step for etching the polysilicon layer by use of a gas plasma including chlorine. The dry etching method prevents an undercut generation along the sidewalls as etching targets, as well as residues remaining in the substrate, thereby improving a reliability of the semiconductor device. The method omits an additional refining process, thereby decreasing a fabrication time of the semiconductor device, improving productivity and realizing cost reduction of the semiconductor device.

14 Claims, 2 Drawing Sheets

DRY ETCHING METHOD OF MULTILAYER FILM

BACKGROUND OF THE INVENTION

1. Field of the Invention

The present invention relates to a dry etching technique, and more particularly to an improved dry etching method of a multilayer film with regard to a semiconductor device including a metallic layer and a polysilicon layer.

2. Description of the Background Art

As semiconductor devices are highly integrated, a high speed LSI (Large Scale Integrated circuit) is strongly required. In order to satisfy a high speed semiconductor device, an inner connection resistance should be decreased, and accordingly a significant interest is directed to a metallic gate to reduce the inner connection resistance of a semiconductor device. Most of all, a dual structure inner connection is now under generalization, wherein a metallic layer or a metallic silicide layer is deposited on a polysilicon layer. In recent years, studies have been made with respect to an inner connection structure by use of a multilayer including a diffusion barrier layer between the polysilicon layer and the metallic layer. In particular, electrical characteristics in relation to an inner connection structure including a tungsten, molybdenum or silicide layer on the polysilicon layer have been explained. However, although there are many of theses dealing with respective etching methods of the polysilicon layer, metallic layer or silicide layer, a further systematic study is required with respect to etching methods of a multilayer including a polysilicon/metallic layer or a polysilicon/metallic-silicide layer.

An etching process of a stacked structure including a polysilicon/metallic layer or a polysilicon/metallic-silicide layer is as follows.

U.S. Pat. No. 5,295,923 discloses an etching method of a multilayer in which either of tungsten, molybdenum, tungsten silicide, molybdenum suicide serving as a metallic layer or a metallic silicide layer is stacked on a polysilicon layer. That is, the metallic or metallic silicide layer deposited on the polysilicon layer is etched in a first step. The first etching step employs an anisotropic etching method by use of a compound gas mixed by a fluorine gas such as $SF_6$, $NF_3$, and a gas selected from HCl, HBr, $Cl_2$, $Br_2$ and $CCl_4$. Then, according to a second step, the polysilicon layer is etched under an anisotropic etching method, by use of a compound gas mixed by a fluorine gas such as $SF_6$, $NF_3$, and a gas selected from $SiCl_4$, fluorine gas, $N_2$, $O_2$ and CO.

In a method for etching a multilayer having a stack structure of polysilicon/nitro-titanium(TiN)/tungsten(W), a W/TiN layer is etched by use of a compound gas mixed by $SF_6$ gas and $Cl_2$ gas in the first step, and the polysilicon layer is etched by use of HBr gas in the second step as disclosed in IEDM proceedings p447–450.

As disclosed in U.S. Pat. No. 5,160,407 which deals with an etching method with regard to a multilayer of polysilicon/titanium-silicide($TiSi_x$) or polysilicon/tantalum-silicide ($TaSi_x$) structure. Therein, $TiSi_x$ or $TaSi_x$ is etched only by $Cl_2$ gas, and polysilicon is etched only by HBr gas.

FIG. 1 is a schematic cross-sectional view of a semiconductor substrate in which a polysilicon/metallic multilayer is etched using a conventional etching method.

As shown therein, on a semiconductor substrate 1 there is formed a polysilicon oxide layer 2. A polysilicon pattern 3 is formed on the silicon oxide layer 2, and a metallic pattern 4a or a silicide pattern 4a and a mask pattern 5 are sequentially formed on the polysilicon pattern 3. Between the pattern stacks and on the silicon oxide layer 2 there are left residues 6 after the etching.

FIG. 2 is a schematic cross-sectional view of a semiconductor substrate according to a conventional etching method, wherein a chlorine gas is employed to remove the leftover residues 6 formed on the silicon oxide layer 2 of FIG. 1. As shown therein, a polysilicon pattern 3a is formed by an undercut process.

FIG. 3 is a schematic cross-sectional view illustrating another example of a semiconductor substrate, wherein a polysilicon/metallic multilayer is etched by a conventional etching method. As shown therein, on a semiconductor substrate 1 there is formed a silicon oxide layer 2, and a polysilicon layer 3b, a metallic layer 4a or a metallic silicide pattern 4a, and a mask pattern 5 are sequentially formed on the silicon oxide layer 2. Therein, the polysilicon layer 3b is not completely etched and part of the silicon oxide layer 2 is left over after the etching.

The residues or the partially leftover polysilicon layer after the etching result from the following reasons. That is, in order to obtain vertical side walls of the metallic layer of the metallic silicide layer, an etching gas is mixed with a fluorine gas such as Ar, He, and a passivation gas such as $O_2$, $N_2$, CO for protecting sidewalls of etching targets. Here, the fluorine gas or passivation gas is reacted to metal and generates a non-volatile remainder, so that there are left over etch-blocking materials on the polysilicon layer and accordingly the leftover etch-blocking materials prohibit a subsequent etching of the polysilicon layer, thereby causing an undesired etch stoppage or generating a significant amount of residues.

Also, as shown in FIGS. 1 and 2, there may occur an undercut between a metallic layer or a metallic silicide layer as an upper layer and a polysilicon layer as a lower layer.

Further, when there is employed a chlorine compound gas to remove the etch blocking layer or the residues, a critical undercut may be incurred, thereby deteriorating characteristics of the semiconductor device.

SUMMARY OF THE INVENTION

The present invention is devised to solve the above-described problems. Accordingly, it is an object of the present invention to provide a dry etching method of a multilayer film including a metallic layer and a polysilicon layer with regard to a semiconductor device, capable of preventing an undercut generation along the sidewalls as etching targets, thereby decreasing a fabrication time of the semiconductor device, improving productivity and realizing cost reduction of the semiconductor device by omission of an additional refining process.

To achieve the above-described object, in a selective etching process of a multilayer structure including an oxide layer, a polysilicon layer, a metallic layer or metallic silicide layer, and a mask pattern which are sequentially formed on a semiconductor substrate, there is provided a dry etching method of a multilayer film according to the present invention which includes a first step for etching the metallic layer or the metallic silicide layer by use of a compound gas plasma mixed by a first gas including at least two of $O_2$, $N_2$, CO, a second gas including fluorine, a third gas including chlorine, and a fourth gas including bromine, a second step for processing the entire structure formed on the semiconductor substrate by use of a fluorine gas plasma including carbon, and a third step for etching the polysilicon layer by use of a gas plasma including chlorine.

The object and advantages of the present invention will become more readily apparent from the detailed description given hereinafter. However, it should be understood that the detailed description and specific example, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

With reference to the accompanying drawings, a dry etching method of a multilayer film including a polysilicon/metallic layer or a metallic silicide layer according to the present invention will now be described.

Figure 1:
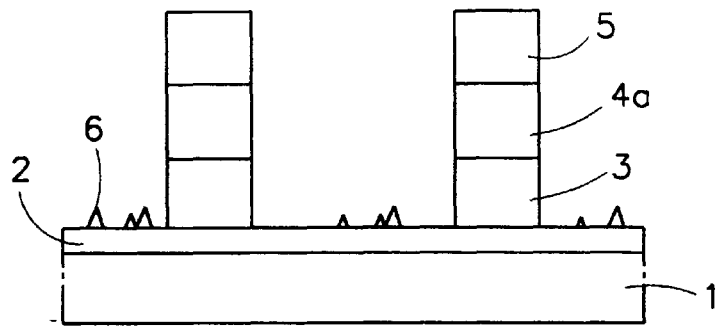
FIGS. 1 through 3 are schematic cross-sectional views of a semiconductor device after a multilayer dry etching according to a background art.
Figure 2:
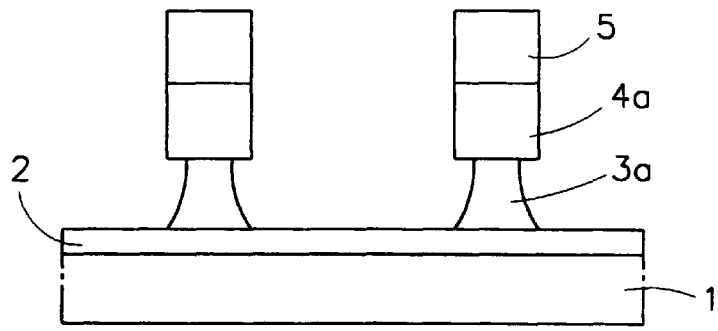
Figure 3:
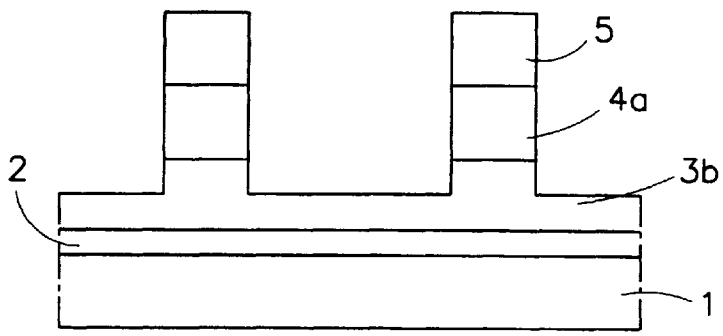
Figure 4A:
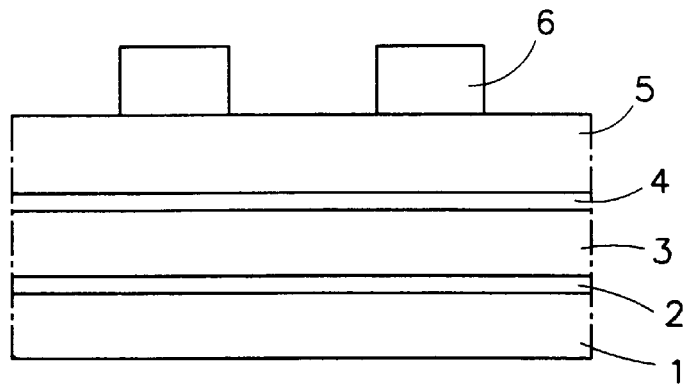
FIGS. 4A through 4C are schematic cross-sectional process views of a semiconductor device for illustrating a dry etching method according to the present invention.

As shown in FIG. 4A, on a semiconductor substrate 11 there are sequentially formed a silicon oxide layer 12 and a polysilicon layer 13. A diffusion barrier layer 14 such as TiN or WSiN is formed on the polysilicon layer 13. On the diffusion barrier layer 14 there is formed a metallic layer 15 such as tungsten W or molybdenum Mo, or a metallic silicide layer 15 such as tungsten silicide, titanium silicide, or molybdenum silicide. In order to carry out an etching process, on the metallic layer 15 or the metallic silicide layer 15 there is formed mask pattern 16 made of photoresist or nitride material. At this time, the diffusion barrier layer 14 formed between the polysilicon 13 and the metallic layer 15 or the metallic silicide layer 15 may be omitted in the meantime.

Figure 4B:
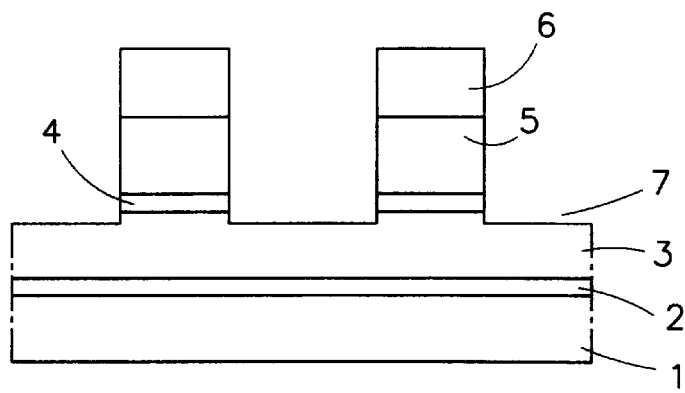

FIG. 4B is a schematic cross-sectional view of a semiconductor device illustrating an etching method according to the present invention, wherein the metallic layer 15 or the metallic silicide layer 15 is etched to form a metallic silicide pattern 15a.

In order to etch the metallic layer 15 or the metallic silicide layer 15, the semiconductor substrate 11 is placed in a vacuum chamber as an etching apparatus, wherein a side electrode of the vacuum chamber is connected to a high frequency voltage for inducing a plasma discharge and another side electrode of the vacuum chamber is connected to a voltage for forming a bias. A compound gas mixed by first gas including at least two of $O_2$, $N_2$, CO, second gas including fluorine, third gas including chlorine, and fourth gas including bromine, is introduced into the vacuum chamber. Then, a voltage is applied to the high frequency electrode and the bias electrode to execute an anisotropic etching. At this time, the diffusion barrier layer 14 is also etched using the etching method used for the metallic layer 15 during the etching of the metallic layer 15 or the metallic silicide layer 15.

As shown in FIG. 4B, when the etching of the metallic layer 15 or the metallic silicide layer 15 is completed, there remain residues 17 or an etch blocking layer 17. Also, by an excessive etching of the metallic layer or the metallic silicide layer, the diffusion barrier layer is etched and an upper portion of the polysilicon layer is partially etched.

Next, in order to remove the residues or the etching barrier layer as shown in FIG. 4B, a carbon containing fluorine plasma is employed for the etching, thereby removing the etching barrier layer 17. At this time, a compound gas of carbon and fluorine is employed, or a compound gas of carbon-fluorine gas and hydrogen gas is employed, and there is used a high density plasma etching device. When there is employed a helicon type etching device among high density plasma etching devices, the etching is carried out under a source power ranging from 100 to 250 W and under a bias power ranging from 30 to 500 W. At this time, the vacuum chamber pressure in the device is maintained in a low pressure of less than 20 mTorr. Also, the time for removing the etching barrier layer is adjusted within 20 seconds.

In addition to the high density plasma etching device, there also may be employed etching devices such as a reactive ion etcher (RIE), a magnetically enhanced reactive ion etcher (MERIE), and a high density plasma etcher, so as to adjust an ion density and an ion energy in the plasma.

Figure 4C:
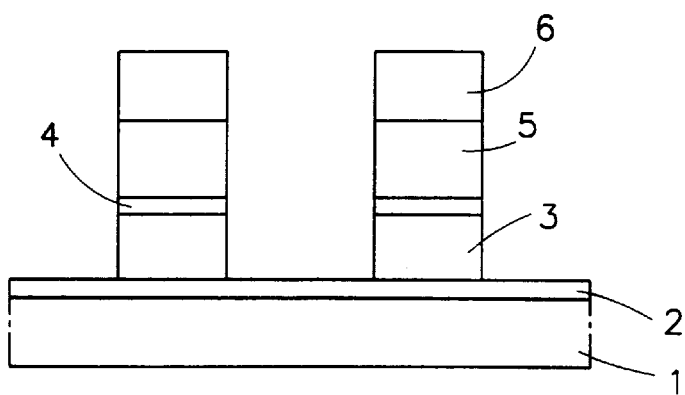

Next, a chlorine gas plasma may be employed within the vacuum chamber, and the cross-sectional view of the semiconductor device after etching the polysilicon layer 3 using the chlorine gas plasma is as shown in FIG. 4C.

In the above-described etching process, there are employed etching devices such as a reactive ion etcher (RIE), a magnetically enhanced reactive ion etcher (MERIE), and a high density plasma etcher, so as to adjust an ion density and an ion energy in the plasma.

As described above, the dry etching method of a multilayer film according to the present invention does not generate undercut along the sidewalls as etching targets, and residues do not remain in the substrate, thereby improving a reliability of the semiconductor device.

Further, because there do not remain residues in the semiconductor substrate, an additional refining process may be omitted, thereby decreasing a fabrication time of the semiconductor device, improving productivity and realizing cost reduction of the semiconductor device.

As the present invention may be embodied in several forms without departing from the spirit of essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within meets and bounds of the claims, or equivalences of such meets and bounds are therefore intended to embrace the appended claims.

What is claimed is:

1. A method for dry etching a multilayer structure formed on a semiconductor device in a vacuum chamber, comprising:

a first step for etching a metallic layer or a metallic suicide layer by use of a compound gas plasma mixed by a first gas including at least two of $O_2$, $N_2$, and CO, a second gas including fluorine, a third gas including chlorine, and a fourth gas including bromine;

a second step for processing the multilayer structure formed on the semiconductor substrate by use of a fluorine gas plasma including carbon; and a third step for etching a polysilicon layer by use of a gas plasma including chlorine.

2. The method of claim 1, wherein the fluorine gas plasma in the second step includes carbon and fluorine, or includes carbon, fluorine and hydrogen.

3. The method of claim 1, wherein the first, second and third steps use an etching device for controlling an ion energy and a plasma density independently or interdependently.

4. The method of claim 3, wherein the etching device employed in the second step is one of a reactive ion etcher (RIE), a magnetically enhanced reactive ion etcher (MERIE), and a high density plasma etcher.

5. The method of claim 4, wherein the high density plasma etcher is a helicon type high density plasma etcher.

6. The method of claim 5, wherein a source power for inducing a static current discharge in the vacuum chamber ranges from 100~2500 W.

7. The method of claim 5, wherein a bias power for being applied to the vacuum chamber ranges from 30~500 W.

8. The method of claim 5, wherein the etching occurs in the vacuum chamber, with use of the helicon type etcher, at a pressure of less than 20 mTorr.

9. The method of claim 1, wherein the second step is executed for approximately 20 seconds.

10. The method of claim 1, wherein the metallic layer includes one of tungsten, molybdenum, and nitro-titanium.

11. The method of claim 1, wherein the metallic silicide layer includes one of tungsten silicide and molybdenum suicide.

12. The method of claim 1, wherein a diffusion barrier layer is formed between the metallic layer and the polysilicon layer.

13. The method of claim 12, wherein the diffusion barrier layer includes one of titanium-nitride (TiN) and WSiN.

14. The method of claim 1, wherein the metallic layer or the metallic silicide layer is excessively etched in the first step to thereby partially etch the polysilicon layer.

* * * * *